July 7, 1970 A. A. VALDETTARO ET AL 3,518,888

COMBINATION VHF-UHF TUNER

Filed Oct. 11, 1968 4 Sheets-Sheet 1

INVENTORS:
ALARICO A. VALDETTARO
JIMMIE E. WARTHAN
By Mason, Kalehmainen Rathburn & Wyss
Attorneys INVENTORS:
ALARICO A. VALDETTARO
JIMMIE E. WARTHAN
By Mason, Kolehmainen Rathburn & Wyss
Attorneys INVENTORS:
ALARICO A. VALDETTARO
JIMMIE E. WARTHAN
By Mason, Kolehmainen
Rathburn & Wyss
Attorneys

COMBINATION VHF-UHF TUNER

Filed Oct. 11, 1968 4 Sheets-Sheet 4

INVENTORS:
ALARICO A. VALDETTARO
JIMMIE E. WARTHAN
By Mason, Kolehmainen
Rathburn & Wyss
Attorneys 3,518,888

COMBINATION VHF-UHF TUNER

Alarico A. Valdettaro, Bloomington, and Jimmie E. Warthan, Stinesville, Ind., assignors to Sarkes Tarzian, Inc., Bloomington, Ind., a corporation of Indiana Filed Oct. 11, 1968, Ser. No. 766,916
Int. Cl. F16h 35/18
U.S. Cl. 74—10.8 14 Claims

ABSTRACT OF THE DISCLOSURE

A combination VHF-UHF television tuner is provided in which the UHF dial shaft is rotatably mounted on the VHF station selector shaft in such manner that the intermediate, concentric fine tuning shaft may be used for memory VHF fine tuning without interference due to side thrust exerted on the UHF dial shaft.

The present invention relates to combination VHF-UHF television tuners, and, more particularly, to such combination tuners which are adapted to provide a so-called memory type of fine tuning for reception of VHF television stations.

Certain arrangements heretofore proposed have provided so-called memory fine tuning for VHF reception wherein the particular setting of the fine tuning knob which gives best reception for each VHF station is "memorized" so that the television set operator need not adjust the VHF fine tuning each time a particular station is tuned in. While these memory fine tuning arrangements are generally suitable for their intended purpose, difficulties arise when VHF tuners equipped with memory fine tuning are combined with UHF tuners to cover the entire VHF-UHF television band. One particular difficulty involves the UHF dial shaft which is usually made concentric with the VHF fine tuning shaft and is employed to drive a suitable UHF dial or indicator. In many instances, a substantial side thrust is exerted on this UHF dial shaft so that a frictional drag is produced on the VHF fine tuning shaft. This frictional drag on the VHF fine tuning shaft may be sufficient to prevent the memory fine tuning return spring from returning the fine tuning mechanism to its neutral position with resultant substantial damage to the VHF tuner.

A further difficulty which arises when combining a VHF memory type tuner with a UHF tuner involves the "feel" of the VHF fine tuning drive mechanism when it is used as a UHF fine and coarse driving mechanism. The memory type of fine tuning drive mechanism usually requires less torque at the start of the fine tuning operation and if this same mechanism is employed for UHF fine tuning it is difficult to obtain an accurate UHF fine tuning adjustment.

Still another difficulty involves the additional loading of the memory fine tuning mechanism. When this mechanism is used as a UHF drive mechanism the additional load of the UHF may exceed the torque requirements of certain television set manufacturers.

It is, therefore, an object of the present invention, to provide a new and improved combination VHF-UHF television tuner which avoids one or more of the above-discussed disadvantages of prior art arrangements.

It is another object of the present invention to provide a new and improved combination VHF-UHF tuner wherein the UHF dial shaft is referenced to the station selector shaft of the VHF tuner and side thrust on this dial shaft does not interfere with the return of the memory fine tuning mechanism to its neutral position.

It is still another object of the present invention to provide a new and improved combination VHF-UHF tuner wherein the drive mechanism for UHF tuner has a uniform torque to provide a smoothly acting UHF control while providing facilities so that this same mechanism can be used for memory VHF fine tuning.

The invention, both as to its organization and method of operation, together with further objects and advantages thereof, will best be understood by reference to the following specification taken in connection with the accompanying drawings in which.

Figure 1:
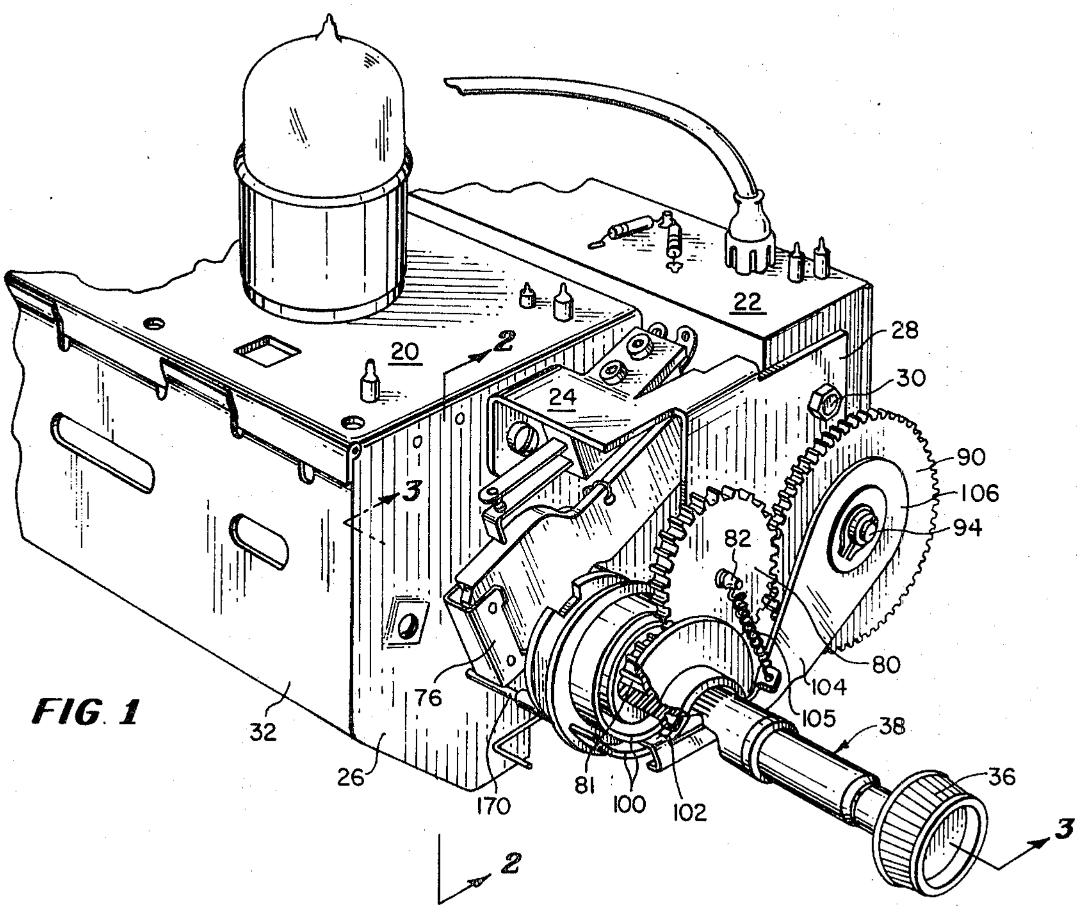
FIG. 1 is a perspective view of a combined VHF-UHF tuner embodying the features of the present invention.

Referring now to the drawings, the combined VHF-UHF tuner of the present invention is therein illustrated as comprising a VHF portion indicated generally at 20 and a UHF portion indicated generally at 22. A main mounting bracket 24 is secured to the front wall 26 of the VHF tuner 20 and the UHF tuner portion 22 is secured to an offset flange portion 28 thereof by means of the screws 30. The chassis of the VHF portion 20 is of generally U-shaped construction and a U-shaped cover member 32 is provided to enclose the electrical parts of the VHF tuner, as will be readily understood by those skilled in the art.

A VHF station selector shaft 34 is rotatably mounted in the end walls of the VHF tuner chassis and a VHF station selector knob 36 is connected to the outer end of the shaft 34. A multi-purpose control shaft assembly indicated generally at 38 is rotatably mounted on the selector shaft 34 and is concentric therewith.

More particularly, the control shaft assembly 38 comprises a plurality of sleeve portions which are interconnected to form a unitary multi-purpose control shaft. Thus, a first sleeve portion 39 of metal is interconnected with a second portion 40 of metal by means of a pair of opposed tongues 41 of the portion 39 which are received in corresponding slots 42 in the member 40. The member 40 is also provided with opposed tongue portions 43 which are received in corresponding slots 44 in a third sleeve member 45 also of metal. The member 45 is provided with rearwardly extending tongue portions 46 which are received in internal recesses in the hub portion 47 of a UHF drive member 48, preferably of insulating material, which is provided with a transversely extending disk 49 at the rear end thereof. The disk 49 is provided with an annular series of forwardly facing drive teeth 50 which are adapted to mesh with a corresponding series of teeth 51 on the rear end of a UHF fine tuning cam member 52 when the tuning mechanism is in the UHF position, as will be described in more detail hereinafter. The control shaft assembly 38 further comprises a VHF fine tuning drive member indicated generally at 53, also preferably of insulating material, which is provided with a pair of slots 54 adapted to receive rearwardly extending tongue portions 55 of the UHF drive member 48. By virtue of the above-described interconnections, the members 39, 40, 45, 48 and 53 all rotate as a single integral unit and comprise the multi-purpose control shaft assembly 38.

It should also be noted that the members 39 and 40, while interconnected by means of the tongues 41 and slots 42 are separated by an amount sufficient to receive a first annular bushing 54 indicated generally at 54 and the members 40 and 45 are separated by an amount sufficient to receive a rear annular bushing indicated generally at 55, the bushings 54 and 55 being employed to provide an independent bearing support for a combined UHF high speed drive member and UHF dial shaft member, indicated generally at 56, as will be described in more detail hereinafter.

Figure 2:
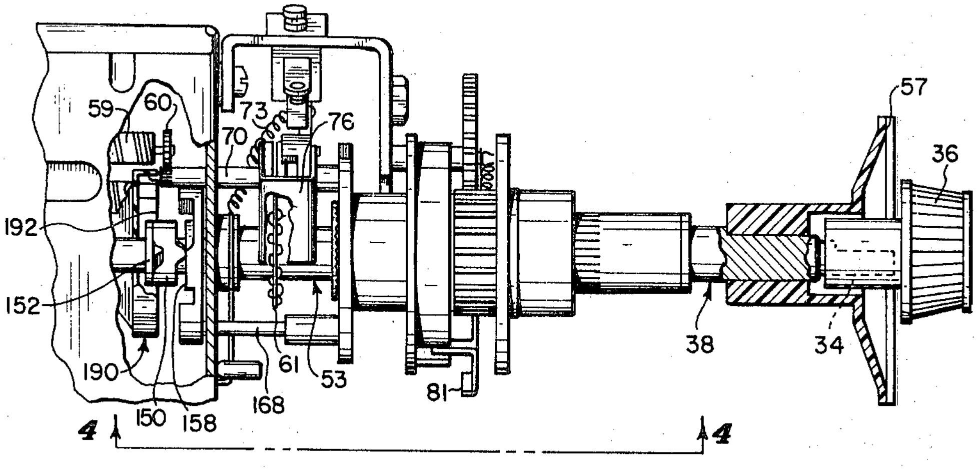
FIG. 2 is a fragmentary right side view, partly in section, taken along the line 2—2 of FIG. 1.
Figure 3:
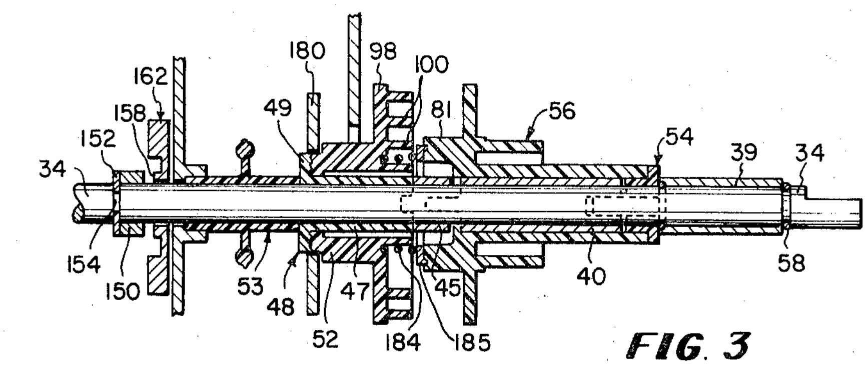
FIG. 3 is a fragmentary, sectional plan view taken along the line 3—3 of FIG. 1 but on a smaller scale.
Figure 4:
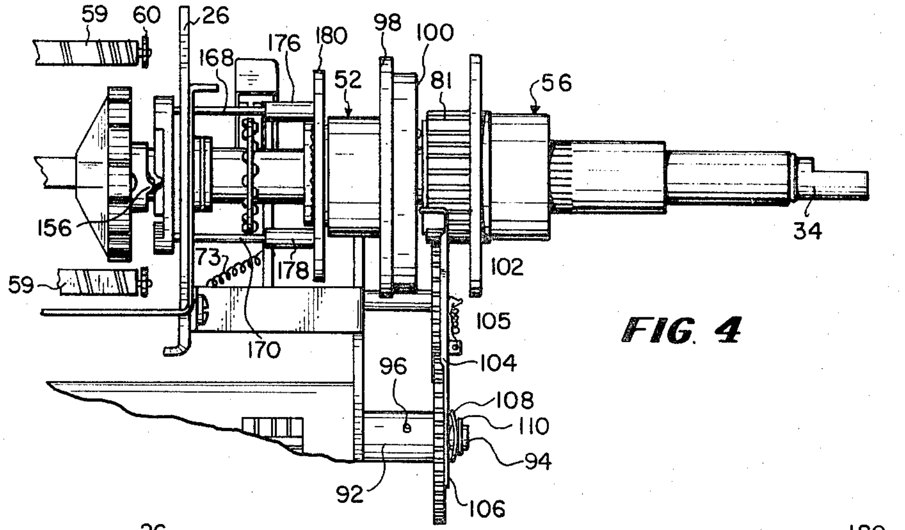
FIG. 4 is a sectional view taken along the lines 4—4 of FIG. 2.

A control knob 57 (FIG. 2) is secured to the outer sleeve portion 39 and when this control knob is rotated, the above-described sections of the assembly 38 are rotated, these sections being held in assembled relation on the shaft 34 by means of a spring retainer 58. The multi-purpose control shaft assembly 38 is arranged to drive a VHF fine tuning arrangement of the so-called memory type when the station selector shaft 34 is in any one of the twelve VHF television channel positions and is also arranged to drive the main tuning shaft of the UHF tuner at two different speeds when the station selector shaft 34 is in a so-called channel 1 or UHF position.

Figures 11, 12, 13, 14, 15, 16, 17:
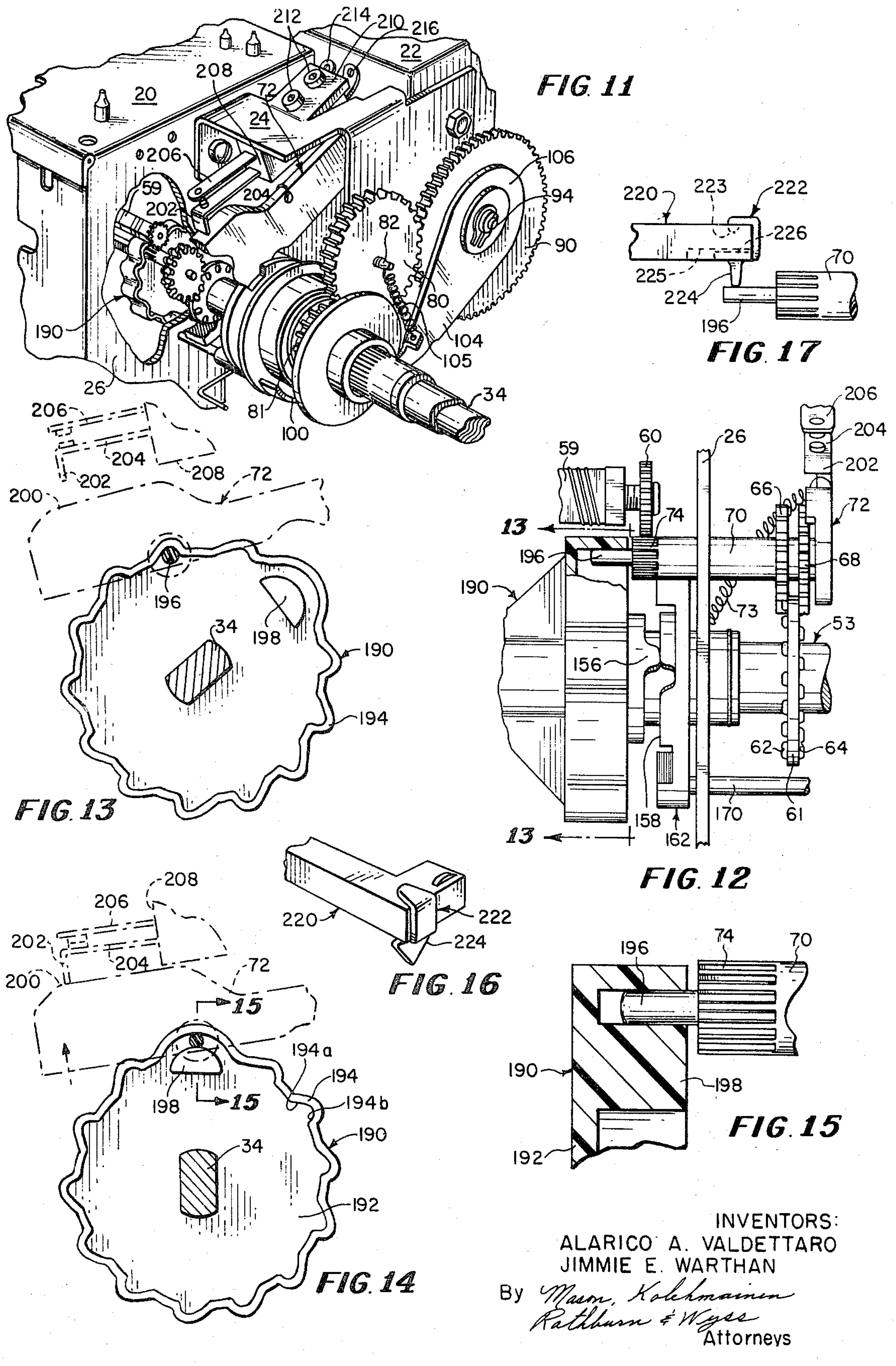
FIG. 11 is a perspective view similar to FIG. 1 but with a portion of the front wall of the VHF tuner broken away to show the mechanism therewithin.
FIG. 12 is a fragmentary sectional view similar to FIG. 4 but shown on an enlarged scale.
FIG. 13 is a sectional view taken along the line 13—13 of FIG. 12.
FIG. 14 is a view similar to FIG. 13 but showing the selector shaft in the UHF tuning position.
FIG. 15 is a sectional view taken along the line 15—15 of FIG. 14.
FIGS. 16 and 17 are different views of an alternate embodiment.

Considering first the arrangement which is provided so that rotation of the control shaft assembly 38 is effective to accomplish a VHF fine tuning operation, the VHF tuner portion 20 is of the so-called turret type wherein a series of twelve elongated tuning sticks 59 are arranged about the axis of the selector shaft 34 and are supported in a turret like structure so that the sticks 59 rotate with the shaft 34 as it is moved to various tuning positions. Each of the sticks 59 carries a gear element 60 which upon rotation moves into or out of the end of the associated tuning stick to accomplish a fine tuning function. A memory fine tuning arrangement is provided whereby a particular one of the tuning sticks 59 which is connected into the stator bar of the tuner may be adjusted by rotation of the gear element 60 thereof and after the fine tuning adjustment is performed the gear element remains in its adjusted position until a new fine tuning adjustment is made for that control channel. One such arrangement is shown, for example, in Badger Pat. No. 3,183,726, which is assigned to the same assignee as the present invention, and reference may be had to this Badger patent for a detailed. description of this type of memory fine tuning arrangement. However, for the purposes of the present invention, it may be stated that a drive disc member 61 extends transversely of the sleeve portion 53 of the shaft assembly 38 and carries two annular sets of gear teeth 62 and 64 on opposite sides thereof. The gears 62 and 64 mesh with corresponding gears 66 and 68 provided on a stub shaft 70 which is rotatably mounted in the end of a pivotally mounted member indicated generally at 72, the member 72 being pivotally mounted on the front wall 26 of the VHF portion 20 and being spring biased by means of the spring 73 so that the teeth of the gears 66 and 68 are fully meshed with the teeth 62 and 64. The stub shaft 70 carries a drive pinion 74 which is adapted to mesh with one of the gear elements 60 when the member 72 is pivoted outwardly away from the selector shaft 34, as shown in FIG. 12, for example. During normal operation the member 72 is held by means of the spring 73 in such position that the drive pinion 74 is inide the path of movement of the gear elements 60. A U-shaped spring clip 76 is provided to exert a restraining load on the shaft 70 so that a substantial force must be exerted on the gears 66, 68 before the shaft 70 can be rotated. Accordingly, when the control shaft assembly portion 53 is initially rotated, by manipulation of the knob 57, the pivotally mounted member 72 is moved outwardly against the force of the spring 73 by the camming action of the teeth 62, 64 upon the teeth of the loaded gears 66, 68 as described in more detail in the above referred to Badger Pat. No. 3,183,726. This outward movement of the member 72 places the pinion 74 in engagement with one of the gear elements 60 and further rotation of the control knob 50 is effective to rotate the selected gear element 60 and produce a VHF fine tuning operation. When the control knob 57 is released the spring 73 functions to move the pivotally mounted member downwardly so that the shaft 70 is again moved outside the path of the gear elements 60. Accordingly, after a VHF fine tuning operation has been performed the station selector shaft 34 may be turned to a different VHF position without interference of the drive pinion 74 with the various elements 60 on the respective VHF tuning sticks 59.

It will be noted that the only force which is effective to move the drive pinion 74 back out of the path of the gear elements 60 is provided by the spring 73 when the knob 57 is released. Furthermore, the spring 73 must be relatively weak since the force thereof must be overcome by the operator in rotating the knob 57 to effect the initial outward movement of the member 72 during the VHF fine tuning operation. Accordingly, if any substantial frictional drag is produced upon the control shaft assembly 38, the spring 73 will not be able to return the member 72 to its normal position, and the pinion 74 will remain in the path of the gear elements 60 and cause substantial damage to the tuner.

In accordance with an important feature of the present invention a UHF drive mechanism is provided for the UHF tuner portion 22 which is so mounted and arranged that it may be driven from the multi-purpose control knob 57 without producing any frictional drag on the control shaft assembly 38, even though substantial side thrust is exerted on the UHF drive mechanism by external means such as a conventional dial stringing arrangement, or the like.

Figure 5:
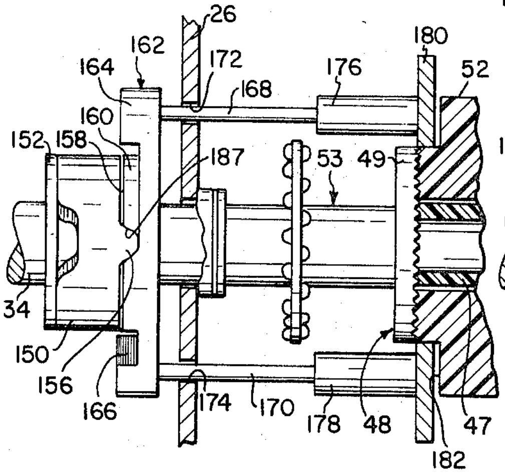
FIG. 5 is a fragmentary sectional view similar to FIG. 4 but shown on an enlarged scale.

The UHF drive assembly includes a portion of the control shaft assembly 38 and the members 52 and 56. More particularly, the members 39, 40, 45 and 48 cooperate to drive the UHF fine tuning cam member 52 through the teeth 50, 51 when the selector shaft 34 is in the UHF position, as shown in FIG. 5. The forward end of the cam member 52 seats in a recess 75 in the rear end of the member 56 which latter member acts both as a UHF high speed drive member and as a UHF dial shaft for driving a suitable UHF dial. However, the member 52 is free to rotate with respect to the member 56 until a forwardly extending lug 76′ on the member 52 engages an internal lug 77 formed in the recess 77 in the member 56 at which time the member 56 is driven directly from the member 52. The member 56 has a bearing sleeve portion 78 the forward portion of which rides on a recessed shoulder portion 79 of the bushing 54. The rear end of the sleeve 78 rides on the periphery of the bushing 55. At the rear end of the member 56 the driving teeth 81 are formed in the periphery thereof, which engage the teeth of an intermediate gear 80 which is rotatably mounted on a pin 82 secured to the front wall of the bracket 24. The intermediate gear 80 engages the teeth of a gear 90 which is keyed to a hub 92 which is secured to the main tuning shaft 94 of the UHF tuner portion 22 by means of a set screw 96 so that rotation of the gear 90 drives the main tuning shaft 94 directly at a relatively high speed.

The UHF main tuning shaft 94 is driven at relatively low speed by means of the cam member 52 which is provided with a transversely extending disc portion 98 in the forward face of which is formed a multi-turn spiral cam 100. The end portion 102 of a cam follower arm 104 rides in the spiral cam 100 and is biased into engagement with one wall thereof by means of the spring 105 which is connected between the arm 104 and the pin 82. The hub portion 106 of the cam follower arm 104 is biased into engagement with the forward face of the gear 90 by means of a spring washer 108 which is secured on the hub 92 by means of a retaining washer 110. Accordingly, when the cam 100 is rotated, the cam follower arm 104 is pivoted through a small arc and since the hub portion 106 is urged into engagement with the gear 90, the UHF main tuning shaft 94 is driven at a relatively slow speed in response to rotation of the cam 100 to effect a UHF fine tuning operation for selection of the desired UHF television station.

Considering now the operation of the above-described UHF drive mechanism, when the parts are in the UHF position of the station selector shaft 34, as shown in FIG. 5, for example, rotation of the control shaft assembly 38 by manipulation of the knob 57 causes rotation of the cam member 52 through the teeth 50, 51 and the cam 100 moves the outer end of the cam follower arm 104 so that it is pivoted at a relatively slow rate and the main UHF tuning shaft 94 is driven at a relatively slow speed to provide UHF fine tuning.

After the member 52 has been rotated somewhat less than 360 degrees, the lug 76' will engage the lug 77 and cause rotation of the high speed drive member 56. When this occurs, the UHF main tuning shaft 94 is driven through the gears 81, 80 and 90 at a relatively high speed. Since the cam follower arm 104 remains biased into engagement with the cam 100, the hub 106 slips with respect to the surface of the gear 90 when this gear is driven at high speed. However, as soon as the approximate range of the desired UHF station is reached at high speed, the knob 57 may be rotated in the opposite direction so that the lugs 76 and 77 are moved apart and high speed drive of the shaft 94 is terminated. The shaft 94 is then driven in the opposite direction at a relatively low speed due to the rotation of the cam 100 which moves the cam follower arm 104.

The UHF tuner portion 22 may comprise any suitable tuning mechanism for receiving UHF television signals and converting the same to a suitable intermediate frequency signal which can be further amplified in the VHF tuner portion 20 when the station selector shaft 34 is in the UHF position. Such arrangements are conventional in the art and need not be further described herein. Conventionally, a series of capacitor plates are secured to the main tuning shaft 94 within the various tuner compartments of the UHF tuner portion 22 and the shaft 94 is rotated through approximately 180 degrees to obtain complete coverage of the UHF television band. The ratios of the gears 90, 80 and 81 are so chosen that the dial sleeve portion 78 of the drive member 56 rotates approximately 360 degrees upon rotation of the shaft 94 through the entire UHF band. Accordingly, a suitable dial or other channel indicator may be pressed onto the sleeve 78, the outer surface of said sleeve being preferably knurled to prevent this UHF dial from slipping. The particular UHF station which is being selected within the UHF tuner portion 22 will then be indicated to the operator of the tuner. In the alternative a pulley may be pressed onto the sleeve 78 and a dial cord or other interconnecting link used to interconnect such pulley with a suitable dial indicator. Under such circumstances a substantial side thrust may be exerted on the sleeve 78. Also, even if a simple dial is connected directly to the sleeve 78, the spring 105 continually exerts a side thrust on the cam 100 and this side thrust is transmitted to the sleeve 78.

In accordance with an important feature of the present invention, the various parts of the UHF drive mechanism are so supported and arranged that they do not produce any substantial frictional drag on the control shaft assembly 38. This means that when the station selector shaft 34 is in a VHF station selecting position and a memory fine tuning operation is performed with respect to that particular VHF station by manipulation of the knob 57, there will be no substantial frictional drag on the control shaft assembly 38 so that the spring 73 will be able to pivot the member 72 to its normal inactive position in which the pinion 74 is outside the path of the gear elements 60. More particularly, the sleeve portion 78 of the member 56 is supported at the front end on the shoulder 79 of the centering bushing 54 and at the rear end thereof on the periphery of the centering bushing 55. The bushings 54 and 55 are rotatably mounted on the selector shaft 34 and are so dimensioned that the sleeve portion 78 is spaced a substantial distance away from the periphery of the adjacent member 40 of the control shaft assembly 38, so that the sleeve 78 does not drag on the member 40 even though a substantial side thrust is exerted on the sleeve portion 78.

In accordance with an important feature of the invention, the bushings 54 and 55 are provided with relatively wide clearance slots to accommodate the tongue portions 41 and 43 so as to permit the control shaft assembly 38 to be returned to the inactive position after a VHF memory fine tuning operation has been completed without any interference from the UHF drive mechanism. Thus, the bushing 54 is provided with wide slots 120 which are of substantially greater width than the width of the tuning portions 41 of the member 39. In a similar manner, the bushing 55 is provided with wide slots 122 which are of substantially greater width than the tongue portions 43 of the member 40.

Figures 8, 9, 10:
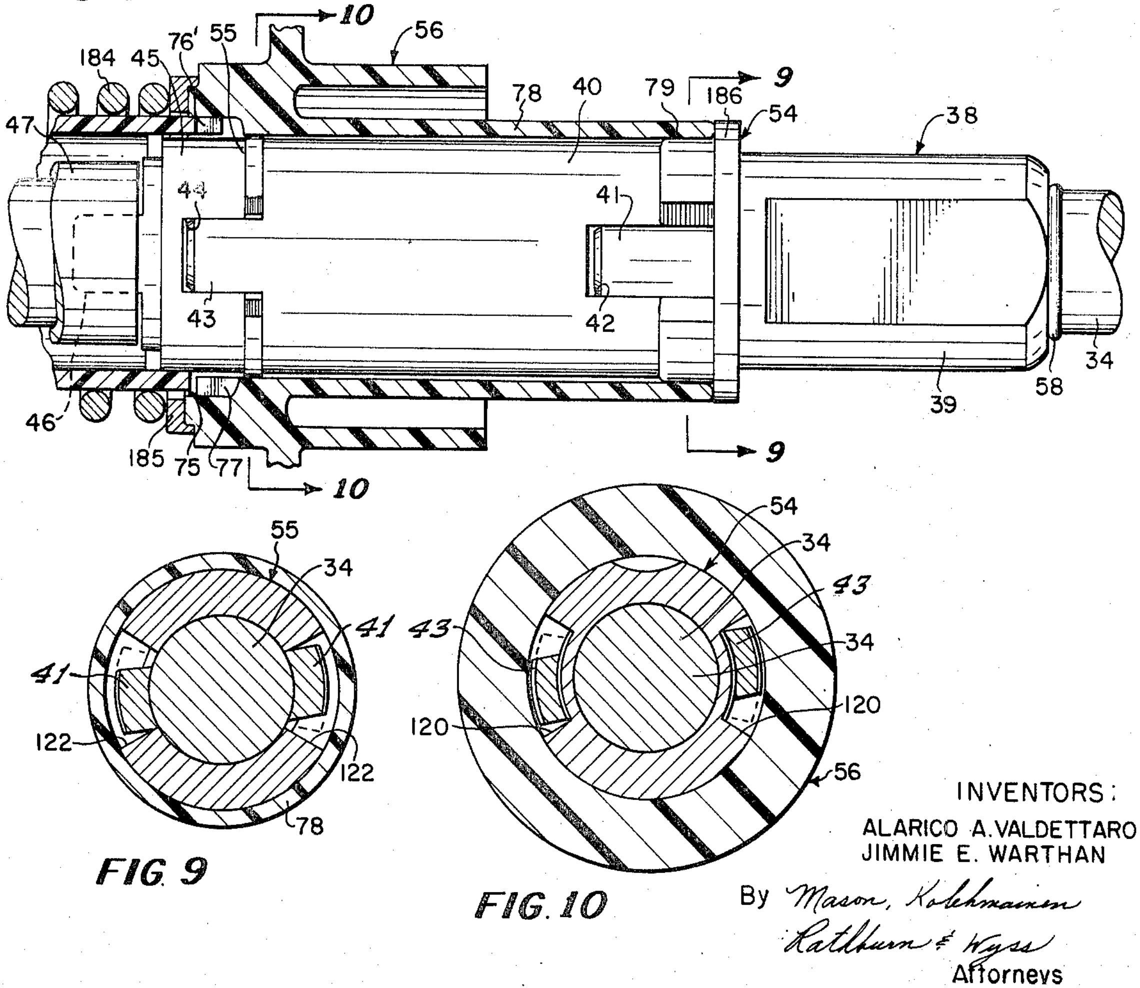
FIG. 8 is a fragmentary sectional view similar to FIG. 3 but taken on an enlarged scale.
FIG. 9 is a sectional view taken along the line 9—9 of FIG. 8.
FIG. 10 is a sectional view taken along the line 10—10 of FIG. 8.

During a VHF memory fine tuning operation, the members 52 and 56 of the UHF drive mechanism are disconnected from the control shaft assembly 38 due to the disengagement of the teeth 50 from the teeth 51. Also, during the VHF memory fine tuning operation, it will be recalled that rotation of the control shaft assembly 38 is employed to shift the pivotally mounted member 72 outwardly against the force of the spring 73 by means of the camming action of the teeth 62, 64 upon the teeth of the gears 66, 68. Further movement of the control shaft assembly 38 in the same direction then causes rotation of the pinion 74 which is in engagement with one of the gear elements 60 so that this particular gear element is rotated to effect a fine tuning operation. During the initial rotation of the control shaft assembly 38, the tongue portions 41 and 43 are moved within the slots 120 and 122 until one edge of each tongue engages the adjacent edge of one of the slots 120, 122 after which engagement the bushings 54 and 55 rotate with the control shaft assembly 38. The UHF drive member 56 is prevented from turning due to the fact that the gears 81, 80 and 90 are interconnected and the gear 90 is connected through the spring washer 108 to the cam follower arm 104 which is in engagement with the cam 100. Accordingly, when the bushings 54 and 55 are rotated they slide readily on the ends of the sleeve portion 78 so that no substantial amount of torque is transmitted to the member 56. However, when the control shaft assembly 38 is released the control shaft assembly 38 is entirely free to move in the opposite direction due to the relatively wide slots 120 and 122. Thus, when the control shaft assembly 38 is released the spring 73 is permitted to move the pivotally mounted member 72 so that the pinion 74 is moved out of the path of the gear element 60. For example, if the control shaft assembly has been moved in the counterclockwise direction as viewed in FIGS. 9 and 10, upon release of the control shaft assembly 38 this assembly is free to move to the position shown in dotted lines in these figures under the force of the spring 73. Also, as noted above, if any side thrust is exerted on the sleeve portion 78 due to a UHF dial drive arrangement, or the like, this force is transmitted directly through the bushings 54, 55 to the center selector shaft 34 so that no substantial frictional drag is exerted on the control shaft assembly 38.

Considering the operation of the bushing 54 and 55 during UHF fine and coarse tuning, in the UHF position of the selector shaft 34, the gear teeth 50 and 51 are meshed so that the control shaft assembly 38 is connected to the UHF drive mechanism. During UHF fine tuning, the member 52 rotates independently of the member 56. The tongue portions 41 and 43 engage the slots 120, 122 and carry the bushings 54 and 55 with the control shaft assembly 38 as the cam 100 functions to pivot the cam follower 104 and cause a fine adjustment of the UHF main tuning shaft 94. When the lug $76^1$ engages the lug 77, the member 56 is then also interconnected with the control shaft assembly 38 and further rotation in the same direction causes the gear teeth 81 on the member 56 to drive the shaft 94 at high speed. During this high speed UHF tuning operation, the bushings 54, 55 and the members 52 and 56 are all interconnected and rotate as a unit with the control shaft assembly 38.

In the VHF positions of the station selector shaft 34, the UHF drive assembly is shifted axially so that the interlocking teeth 50 and 51 are moved out of engagement More particularly, the station selector shaft 34 is provided with a double D cross section within the VHF tuner chassis, and a sleeve 150, having a corresponding double D opening therein, is mounted on the shaft 34 inside of the front wall 26 of the tuner chassis, the sleeve 150 being prevented from moving rearwardly by means of a retaining washer 152 which is positioned in a groove 154 in the shaft 34. The sleeve 150 is provided with a projecting lug portion 156 which rides on the rear surface 158 of a central hub portion 160 of a member 162 which is slidably mounted on the selector shaft 34. The member 162 is provided with circular boss portions 164 and 166 at the opposed outer ends thereof within which are mounted a pair of roll pins 168 and 170, respectively, which extend through openings 172 and 174 in the front wall 26 of the VHF tuner chassis. The pins 168 and 170 extend into suitable openings in sleeve portions 176 and 178 which are formed integrally with and extend rearwardly from an annular plate 180 which is arranged to seat on an annular shoulder 182 formed in the end of the drive member 52 beyond the periphery of the teeth 51.

Figure 6:
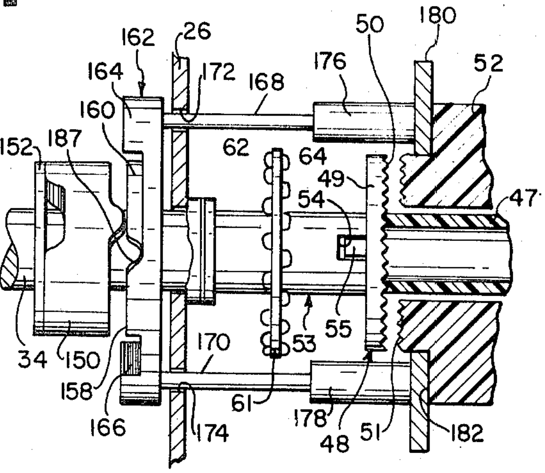
FIG. 6 is a view similar to FIG. 5 but showing the drive mechanism in a different position.
Figure 7:
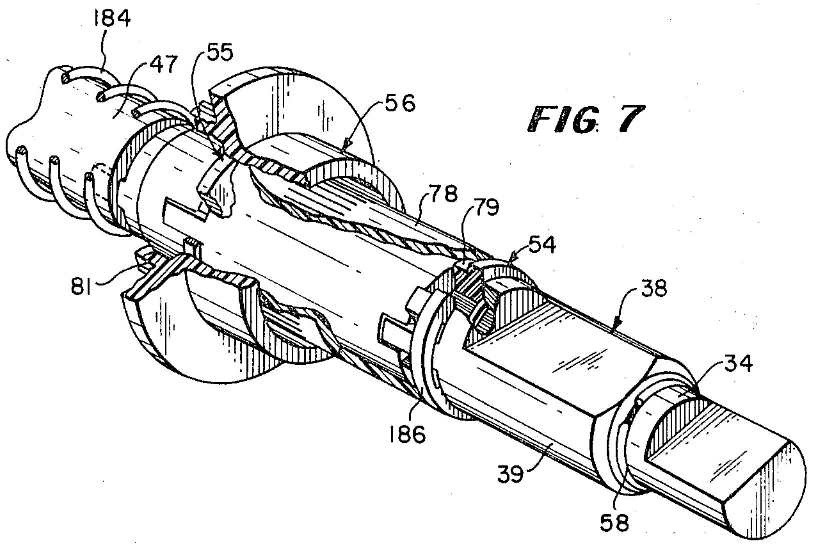
FIG. 7 is a fragmentary perspective view similar to FIG. 3 and illustrating the manner in which the drive mechanism is supported.

As stated above, the sleeve 150 is keyed to the VHF station selector shaft 34, so that in all VHF positions of the shaft 34 the lug 156 rides on the end surface 158 of the member 162. A coil spring 184, which is positioned between a metal ring 185, mounted on the rear end of the member 56, and the member 52 adjacent the inner end of the cam 100, urges the part 52 of the UHF drive assembly rearwardly, the member 56 being prevented from moving forwardly by engagement of the forward end thereof with the flange portion 186 of the bushing 54. The roll pins 168 and 170 are so dimensioned that the ends of these pins engage the bottoms of the openings in the sleeve portions 176 and 178 so that the drive member 52 is held disengaged from the member 48 in all VHF positions of the selector shaft 34, this position of the shifting mechanism being shown in FIG. 6.

A notch 187 (FIG. 6) is provided in the hub portion 160 of the member 162 and the member 162 is so oriented relative to the station selector shaft 34 that when this shaft is in the UHF position, the lug 156 on the sleeve 150 drops into the notch 187 in the member 162, as shown in FIG. 5. When this occurs, the coil spring 184 urges the UHF drive member 52 rearwardly until the teeth 51 engage the teeth 50 and the spring 184 functions to hold these teeth tightly in engagement so that a positive connection is provided between the control shaft assembly 38 and the UHF drive assembly. Accordingly, in the UHF position of the station selector shaft 34, the control knob 57 may be employed to provide two-speed UHF tuning of the UHF tuner portion 22, as described in detail heretofore.

In this connection, it is pointed out that the roll pins 168 and 170 are precisely positioned within the member 162 so that there will be a slight clearance between the plate 180 and the drive member 52 when the lug 156 falls into the notch 187 in the UHF position of the shaft 34, as illustrated in FIG. 5. This slight clearance insures that the spring 184 can produce a positive driving engagement between the teeth 50 and 51 for UHF two-speed tuning.

In this connection it will be noted that the VHF-UHF shifting mechanism does not require a longitudinal movement of the member 56. Accordingly, the UHF dial or other indicating arrangement controlled by the member 56 is not moved relative to the cabinet of the receiver when changing from VHF to UHF operation. It is also pointed out that the VHF-UHF shifting mechanism described above may be readily assembled by first assembling the member 150 and 162 on the tuner shaft 34 with the pins 168 and 170 extending through the apertures 172 and 174. The plate 180 is then slid onto the ends of the pins 168 and 170 and the UHF drive assembly is then assembled onto the control shaft assembly 38.

In accordance with a further feature of the invention, a camming member indicated generally at 190 is mounted on the selector shaft 34 for rotation therewith. The camming member 190 includes a transverse disk portion 192 which terminates in a scalloped forwardly turned skirt portion 194. The shaft 70, which is rotatably mounted in the member 72, is provided with a projecting nub portion 196 which is arranged to be positioned inside the scallops of the skirt 194 of the member 190. Each time the selector shaft 34 is moved to a different VHF position, the camming member 190, by engagement of the skirt 194 thereof with the projecting nub 196, moves the shaft 70, and hence the pinion 74, away from the gear element 60. Due to the forces acting on the member 72 and the positions of the pivot point of the member 72 relative to the camming member 190, a force component is developed which aids rotation of the shaft 34 in one direction of rotation thereof and opposes said rotation when in the opposite direction. In accordance with a further feature of the invention, the slopes of the shoulders 194*a* and 194*b*, of each of the scallops in the skirt portion 194 are arranged so that a relatively gentle slope is provided in the direction in which movement is opposed and a relatively steep slope is provided in the direction in which movement is aided. As a result, the torque necessary to rotate the shaft 34 in another direction is equalized so that the nub portion 196 may be moved smoothly from one scallop to the next in either direction of rotation of the selector shaft 34.

When the selector shaft 34 is moved to the UHF position, the nub portion 196 is engaged by a forwardly projecting camming lug 198 formed in the camming member 190 with the result that the pivotally mounted member 72 is moved outwardly away from the shaft 34 from the position shown in FIG. 13 to the position shown in FIG. 14. When this occurs, the upper edge 200 of the member 72 engages a downturned portion 202 of a flexible switch blade 204 and moves this blade upwardly so that contacts carried thereby are electrically connected to a contact mounted on an upper switch blade 206. The switch blades 204 and 206 are mounted in a support member 208 which is in turn mounted on an upturned flange portion 210 of the bracket 24 by means of the bolts 212.

Accordingly, a suitable indicator lamp circuit connected to the terminals 214 and 216, i.e., the switch contacts 204 and 206, is closed when the selector shaft 34 is moved to the UHF position. The operator is thus informed that the television set is capable of receiving UHF television stations.

The pivotally mounted member 72 is shifted outwardly away from the selector shaft 34, by engagement of the lug 198 with the nub portion 196, by an amount sufficient to cause the teeth 62, 64 to be completely disengaged from the gears 66, 68 carried by the shaft 70. Normally, the gears 66, 68 are loaded by the spring clip 76 so that a substantial force must be exerted on the shaft assembly 38 to force the lever 72 to pivot to the VHF fine tuning position. During UHF tuning, particularly UHF fine tuning, this loading effect of the clip 76 is undesirable because it interferes with accurate UHF tuning to a desired channel. However, by holding the lever 72 outwardly during UHF tuning by an amount such that the teeth 62, 64 do not engage the gears 66, 68, a minimum load is placed on the control shaft assembly 38 for both UHF fine and coarse tuning. As soon as the selector shaft 34 is moved to one of the VHF positions, the nub portion 196 is moved out of engagement with the lug 198 and is free to follow the scallops of the member 190. In this connection it will be understood that the UHF or channel 1 tuning stick which is used when the shaft 34 is in the UHF position, is not provided with a gear element 60 since no tuning of the VHF local oscillator is required during UHF reception, as will be understood readily by those skilled in the art.

In accordance with a further feature of the invention, the alternative arrangement shown in FIGS. 16 and 17 may be employed to control the position of the pivotally mounted member 72 when the selector shaft 34 is in the UHF position. Referring to these figures, the UHF tuning stick or channel 1 stick 220 is, in this embodiment, provided with a camming member 222 which is secured to the end of the stick 220 and is provided with a transverse, triangularly-shaped camming portion 224 which extends inwardly from the stick 220 toward the selector shaft 34. The camming portion 224 of the member 222 is arranged to engage the projecting nub portion 196 on the end of the shaft 70 and functions to move the pivotally mounted member 72 inwardly toward the selector shaft 34 by an amount such that the gear teeth 62, 64 are completely meshed with the gears 66, 68 on the shaft 70. Furthermore, the camming member 224 holds the member 72 in its neutral VHF position during UHF tuning and against the camming force exerted by the teeth 62, 64 on the gears 66, 68 when the control shaft assembly 38 is rotated in either direction. The arrangement shown in FIGS. 16 and 17 thus has the advantage that a uniform torque or loading is experienced upon rotation of the control knob 57 in either direction during UHF fine and coarse tuning. While the arrangement shown in FIGS. 16 and 17 does not remove the loading effect of the clip 76 on the rotation of the gears 66, 68, as in the case of the camming member 190, the arrangement shown in FIGS. 16 and 17 does provide a uniform "feel" for the control knob 57 and removes the effect of sloppiness in the UHF fine tuning which would be experienced if the shaft 70 were not held in the inward position by the cam 224. In this connection, it will be understood that the cam 222 is provided only on the channel 1 stick 220 and a similar cam member is not provided on any of the VHF tuning sticks. Accordingly, during VHF tuning the pivotally mounted member 72 is free to move outwardly by virtue of the camming action of the teeth 62, 64 on the gears 66, 68 so that the pinion 74 can be engaged with a selected one of the gear elements 60 in VHF positions of the shaft 34. The cam member 222 is preferably constructed of a suitable plastic material so that the edges of the triangularly shaped cam 224 will smoothly engage the nub portion 196. While the member 222 may be secured to the stick 220 in any suitable manner, in the illustrated embodiment, the member 222 is in the form of a generally U-shaped clip the upper arm of which is provided with a small lug 223 which fits into a corresponding aperture in the top surface of the stick 220. Also, a groove 225 is formed in the bottom edge of the stick and is adapted to receive the portion 226 of the member 222. With this construction, a standard form of tuning stick may be readily adapted by simply snapping the member 222 in place.

While there have been illustrated and described various embodiments of the present invention, it will be apparent that various changes and modifications thereof will occur to those skilled in the art. It is intended in the appended claims to cover all such changes and modifications as fall within true spirit and scope of the present invention.

What is claimed as new and desired to be secured by Letters Patent of the United States is:

1. A combined VHF-UHF television tuner, comprising a VHF station selector shaft having a plurality of VHF station selecting positions and a UHF position, a multipurpose control shaft concentric with said VHF station selector shaft, said control shaft having a plurality of transverse slots extending therethrough and spaced apart along the length thereof, a plurality of bearing members positioned in said slots and riding on said VHF station selector shaft, said bearing members projecting beyond the periphery of said control shaft, a UHF main tuning shaft, a UHF drive assembly concentric with said control shaft, means including said bearing members for supporting said UHF drive assembly in spaced relation to said control shaft to permit limited rotation of said control shaft independently therefrom, means responsive to movement of said VHF station selector shaft to said UHF position for connecting said control shaft to said UHF drive assembly, and means interconnecting said UHF drive assembly with said UHF main tuning shaft.

2. A combined VHF-UHF television tuner, comprising a VHF station selector shaft having a plurality of VHF station selecting positions and a UHF position, a multipurpose control shaft concentric with said VHF station selector shaft, said control shaft having a plurality of transverse slots extending therethrough and spaced apart along the length thereof, a plurality of bearing members positioned in said slots and riding on said VHF station selector shaft, said bearing members projecting beyond the periphery of said control shaft, a support structure rotatable with said VHF station selector shaft and carrying a plurality of individually adjustable gear elements for fine tuning adjustment to different VHF television stations, said gear elements moving in a predetermined path when said VHF station selector shaft is rotated, a movably mounted member carrying a driving gear, means for biasing said movably mounted member to a first position in which said driving gear is outside said path, means responsive to movement of said control shaft for moving said member to a second position in which said driving gear engages a selected one of said gear elements and for thereafter rotating said selected gear element to effect a VHF fine tuning operation, a UHF main tuning shaft, a UHF drive assembly concentric with said control shaft, means including said bearing members for supporting said UHF drive assembly away from said control shaft, said bearings being separated from the adjacent portions of said control shaft by an amount sufficient to permit said biasing means to return said movably mounted member to said first position when said control shaft is released at the end of a VHF fine tuning operation even though a substantial side thrust is exerted on said UHF drive assembly, means responsive to movement of said VHF station selector shaft to said UHF position for connecting said control shaft to said UHF drive assembly, and means interconnecting said UHF drive assembly with said UHF main tuning shaft.

3. In a television tuner, the combination of a selector shaft, control sleeve means surrounding said selector shaft and concentric therewith, a dial sleeve surrounding said control sleeve means and concentric therewith, said control sleeve means having a plurality of transverse slots therein, bearing means positioned on said selector shaft and having portions extending outwardly through said slots, and means supporting said dial sleeve on said outwardly extending portions of said bearing means in spaced relation to the periphery of said control sleeve so that side thrust on said dial sleeve does not produce a frictional drag on said control sleeve.

4. The combination as set forth in claim 3 wherein said transverse slots are of sufficient width relative to said outwardly extending portions to permit limited rotation of said conrol sleeve means independently of said bearing means.

5. The combination as set forth in claim 3 wherein said control sleeve means comprises a plurality of tubular sections interconnected by tongue and groove means to define said transverse slots.

6. A combined VHF-UHF television tuner, comprising a VHF station selector shaft having a plurality of VHF station selecting positions and a UHF position, a multi-purpose control shaft concentric with said VHF station selector shaft, a UHF main tuning shaft, a UHF indicator sleeve concentric with said control shaft, bearing means extending transversely through said control shaft for rotatably supporting said UHF indicator sleeve on said selector shaft in spaced relation to said control shaft, means responsive to movement of said VHF station selector shaft to said UHF position for connecting said control shaft to said UHF indicator sleeve, and drive means interconnecting said control shaft with said UHF main tuning shaft when said VHF station selector shaft is in said UHF position.

7. In a combined VHF-UHF television tuner, the combination of a VHF station selector shaft having a plurality of VHF station selecting positions and a UHF position, a multi-purpose control shaft concentric with said VHF station selector shaft, a support structure rotatable with said VHF station selector shaft and carrying a plurality of individually adjustable gear elements for fine tuning adjustment to different VHF television stations, said gear elements moving in a predetermined path when said VHF station selector shaft is rotated, a movably mounted member carrying a driving gear, means for biasing said movably mounted member to a first position in which said driving gear is outside said path, means responsive to movement of said control shaft for moving said member to a second position in which said driving gear engages a selected one of said gear elements and for thereafter rotating said selected gear element to effect a VHF fine tuning operation, a UHF indicator sleeve concentric with said control shaft, and bearing means extending transversely through said control shaft for rotatably supporting said UHF indicator sleeve on said selector shaft in spaced relation to said control shaft and arranged to permit rotation of said control shaft by an amount sufficient to permit said biasing means to return said movably mounted member to said first position when said control shaft is released at the end of a VHF fine tuning operation even though a substantial side thrust is exerted on said UHF indicator sleeve.

8. In a combined VHF-UHF television tuner, the combination of a VHF station selector shaft having a plurality of VHF station selecting positions and a UHF position, a multi-purpose control shaft concentric with said VHF station selector shaft, said control shaft having a plurality of transverse slots extending therethrough and spaced apart along the length thereof, a plurality of bearing members positioned in said slots and riding on said VHF station selector shaft, said bearing members projecting beyond the periphery of said control shaft, a support structure rotatable with said VHF station selector shaft and carrying a plurality of individually adjustable gear elements for fine tuning adjustment to different VHF television stations, said gear elements moving in a predetermined path when said VHF station selector shaft is rotated, a movably mounted member carrying a driving gear, means for biasing said movably mounted member to a first position in which said driving gear is outside said path, means responsive to movement of said control shaft for moving said member to a second position in which said driving gear engages a selected one of said gear elements and for thereafter rotating said selected gear element to effect a VHF fine tuning operation, a UHF dial indicator sleeve concentric with said control shaft, means including said bearing members for supporting said dial indicator sleeve in spaced relation to said control shaft, said bearings being separated from the adjacent portions of said control shaft by an amount sufficient to permit said biasing means to return said movably mounted member to said first position when said control shaft is released at the end of a VHF fine tuning operation even though a substantial side thrust is exerted on said UHF indicator sleeve.

9. In a combined VHF-UHF television tuner, the combination of a VHF station selector shaft having a plurality of VHF station selecting positions and a UHF position, a multi-purpose control shaft concentric with said VHF station selector shaft, a support structure rotatable with said VHF station selector shaft and carrying a plurality of individually adjustable gear elements for fine tuning adjustment to different VHF television stations, said gear elements moving in a predetermined path when said VHF station selector shaft is rotated, a movably mounted member carrying a driving gear, means for biasing said movably mounted member to a first position near said selector shaft in which position said driving gear is removed from said path, control means responsive to a first initial rotary movement of said control shaft in either direction for moving said member outwardly to a second position in which said driving gear engages a selected one of said gear elements and for thereafter rotating said selected gear element to effect a VHF fine tuning operation in response to further rotary movement of said control shaft in the same direction, a UHF drive assembly concentric with said control shaft, means responsive to movement of said VHF station selector shaft to said UHF position for connecting said control shaft to said UHF drive assembly, and means operative when said selector shaft is in said UHF position for holding said member in said first position independently of said control means.

10. The combination as set forth in claim 9, wherein said support structure comprises a plurality of tuning coil units mounted in a turret structure for rotation with said selector shaft, each of said tuning coil units having one of said adjustable gear elements extending from one end thereof, and said holding means comprises an elongated member supported in said turret structure in said UHF position and having a cam portion adapted to engage said movable member when said selector shaft is moved to said UHF position.

11. The combination as set forth in claim 10, wherein said elongated member comprises a tuning coil unit for use in said UHF position, and said cam portion comprises a plastic member removably secured to the end of said UHF tuning coil unit.

12. A combined VHF-UHF television tuner, comprising a VHF station selector shaft having a plurality of VHF station selecting positions and a UHF position, a support structure rotatable with said VHF station selector shaft and carrying a plurality of individually adjustable gear elements for fine tuning adjustment to different VHF television stations, said gear elements moving in a predetermined path when said VHF station selector shaft is rotated, a multi-purpose control shaft concentric with said VHF station selector shaft, a pivotally mounted member carrying a driving gear, said member being normally biased to a position such that said driving gear is outside said predetermined path, a first gear on said control shaft, a second gear on said pivotally mounted member and in engagement with said first gear, means for loading said second gear so that it can be rotated only by exerting a substantial force thereon, whereby in response to rotation of said control shaft said pivotally mounted member is moved to a position in which said driving gear engages one of said gear elements by the camming action of the teeth of said first gear on the teeth of said loaded second gear and rotates said one gear element to effect a VHF fine tuning operation, a UHF main tuning shaft, a UHF drive assembly concentric with said control shaft, means responsive to movement of said station selector shaft to said UHF position for connecting said control shaft to said UHF drive assembly and for moving said pivotally mounted member to a point at which said first and second gears do not engage, thereby to remove the loading effect of said second gear from said control shaft, and means interconnecting said UHF drive assembly with said UHF main tuning shaft to drive the same at two different speeds in response to rotation of said control shaft when said station selector shaft is in said UHF position.

13. A combined VHF-UHF television tuner, comprising a VHF station selector shaft having a plurality of VHF station selecting positions and a UHF position, a support structure rotatable with said VHF station selector shaft and carrying a plurality of individually adjustable gear elements for fine tuning adjustment to different VHF television stations, said gear elements moving in a predetermined path when said VHF station selector shaft is rotated, a multi-purpose control shaft concentric with said VHF station selector shaft, a pivotally mounted member carrying a driving gear, said member being normally biased to a position such that said driving gear is outside said predetermined path, a first gear on said control shaft, a second gear on said pivotally mounted member and in engagement with said first gear, means for loading said second gear so that it can be rotated only by exerting a substantial force thereon, whereby in response to rotation of said control shaft said pivotally mounted member is moved to a position in which said driving gear engages one of said gear elements by the camming action of the teeth of said first gear on the teeth of said loaded second gear and rotates said one gear element to effect a VHF fine tuning operation, a UHF main tuning shaft, a UHF drive assembly concentric with said control shaft, means responsive to movement of said station selector shaft to said UHF position for connecting said control shaft to said UHF drive assembly, means interconnecting said UHF drive assembly with said UHF main tuning shaft to drive the same at two different speeds in response to rotation of said control shaft when said station selector shaft is in said UHF position, and a cam member secured to and rotatable with said station selector shaft, said cam member operating to position said driving gear for engagement with a selected one of said gear elements in each of said VHF positions of said station selector shaft and to position said pivotally mounted member at a point at which said first and second gears are not engaged when said station selector shaft is moved to said UHF position, thereby to remove the loading effect of said second gear on said control shaft when said station selector shaft is in said UHF position.

14. A combined VHF-UHF tuner as set forth in claim 13, wherein there is provided means responsive to movement of said pivotally mounted member to said point for producing a UHF tuning indication.

References Cited

UNITED STATES PATENTS

| | | | |
|---|---|---|---|
| 2,788,668 | 4/1957 | Sperber | 74—10.45 |
| 3,270,570 | 9/1966 | Stouffer | 74—10.5 |
| 3,316,770 | 5/1967 | Badger et al. | 74—10.8 |
| 3,413,861 | 12/1968 | Moritz et al. | 74—10.5 |

MILTON KAUFMAN, Primary Examiner

U.S. Cl. XR.

74—10.45, 10.5, 10.6